(12) United States Patent
Takahashi

(10) Patent No.: US 6,804,124 B2
(45) Date of Patent: Oct. 12, 2004

(54) INSERTION/REMOVAL JIG FOR PRINTED CIRCUIT BOARD

(75) Inventor: Isao Takahashi, Minato-ku (JP)

(73) Assignee: NEC Corporation, Tokyo (JP)

( * ) Notice: Subject to any disclaimer, the term of this patent is extended or adjusted under 35 U.S.C. 154(b) by 290 days.

(21) Appl. No.: 10/145,031

(22) Filed: May 15, 2002

(65) Prior Publication Data

US 2002/0172027 A1 Nov. 21, 2002

(30) Foreign Application Priority Data

May 21, 2001 (JP) .......................... 2001-151099

(51) Int. Cl.[7] .................................. H05K 7/12
(52) U.S. Cl. .................. 361/798; 361/801; 361/759; 361/740; 361/747
(58) Field of Search ................... 361/732, 740, 361/741, 747, 759, 798, 796, 801, 802

(56) References Cited

U.S. PATENT DOCUMENTS 4,413,399 A * 11/1983 Crawford et al. ............. 29/428
4,454,552 A * 6/1984 Barnes et al. ................. 361/9

FOREIGN PATENT DOCUMENTS

JP           6-232572 A      8/1994

* cited by examiner

*Primary Examiner*—David Martin
*Assistant Examiner*—Dameon E. Levi
(74) *Attorney, Agent, or Firm*—Sughrue Mion, PLLC

(57) ABSTRACT

An insertion/removal jig for a printed circuit board to be used for pulling out a printed circuit board of an electronic equipment, constituted by having a card-holding portion for holding the printed circuit board upon pulling out said board, a movable frame formed to be integral with the card-holding portion, a stationary frame provided with a support point working as a fulcrum for permitting the printed circuit board to be pulled out, and holding the movable frame to be movable in a direction for the insertion and removal of the printed circuit board, and a breakage-preventing portion interconnecting between the stationary frame and the support point via an elastic body shrunk by a force that is larger than a force necessary for pulling out the printed circuit board but smaller than a force for fixing of components, which are mounted on the printed circuit board.

16 Claims, 6 Drawing Sheets

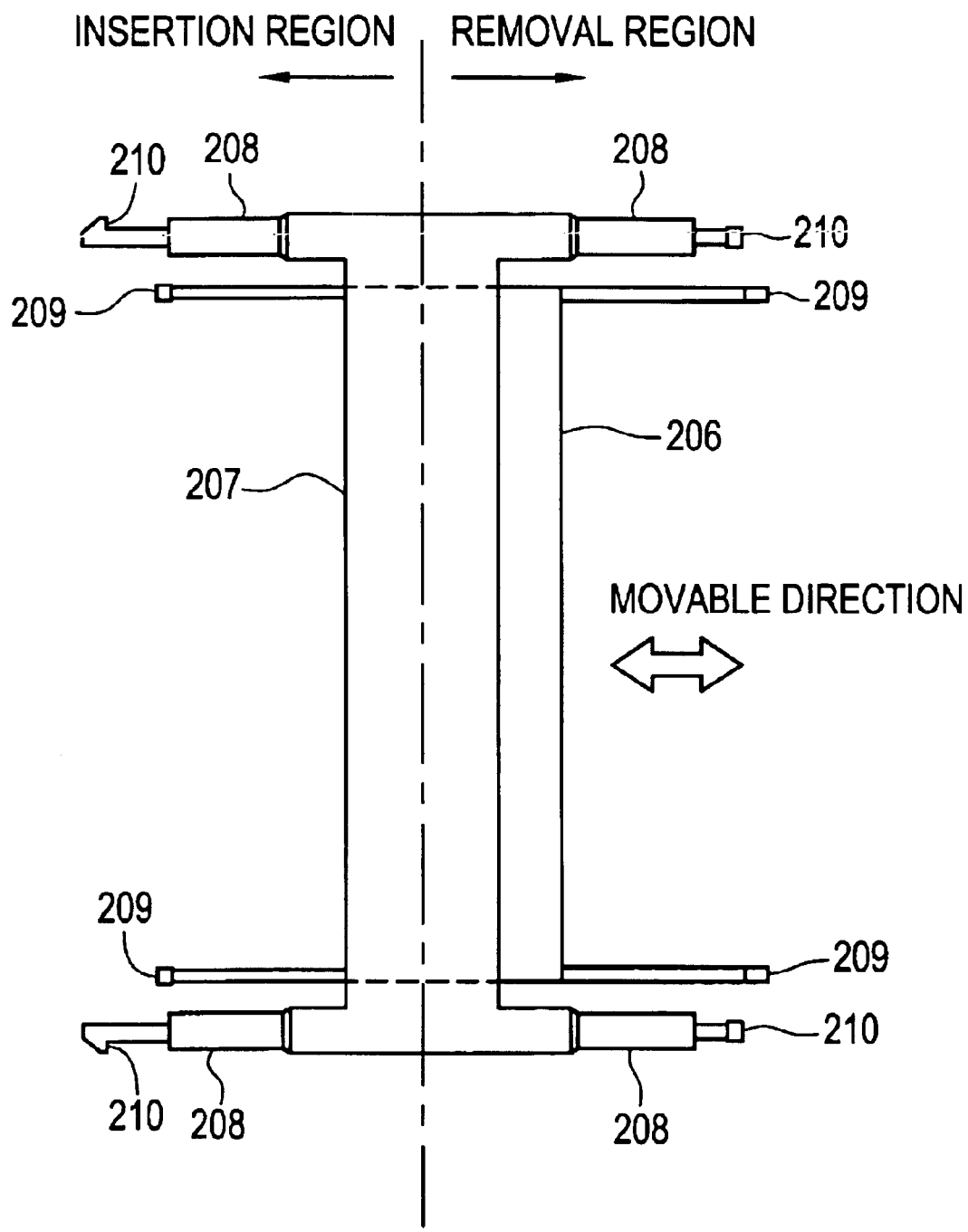

INSERTION/REMOVAL JIG FOR PRINTED CIRCUIT BOARD

BACKGROUND OF THE INVENTION

1. Field of the Invention

The present invention relates to an insertion/removal jig for a printed circuit board, used for inserting a printed circuit board mounting thereon electronic circuits and other components into electronic equipment, and/or for taking the board out of the electronic equipment.

2. Description of the Related Art

An example of electronic equipment in which a printed circuited board is inserted is illustrated in FIG. 1. The electronic equipment is provided with, inserted therein, printed circuit board 1 mounting thereon various electronic circuits and other components so as to provide the functions required for the equipment. This kind of printed circuit board 1 employs various types of connectors 2 functioning as interface for the supply of electric power and for transmitting and receiving predetermined signals of external equipment. Also, cable connectors 3 to which cables and so on are attached are insertably and removably secured to connectors 2 mounted on printed circuit board 1.

As illustrated in FIG. 1, printed circuit board 1 is held by card support cage 4 (the frame of the electronic equipment) to be movable in a predetermined insertion and removal direction. Connectors 2 are mounted on, for example, the surface of printed circuit board 1 under various restrictions on the shape of the electronic equipment and the space for the mounting of connectors 2. According to the above-described composition, a direction in which cable connectors 3 are inserted and/or taken out corresponds to a direction vertical to the insertion/removal direction of printed circuit board 1, and therefore cable connectors 3 are inserted in associated connectors 2 after being guided by connector guide 5 provided on the frame to the positions adjacent to associated connectors 2.

During the maintenance operation, where the composition of FIG. 1 is adopted, and when printed circuit board 1 is pulled out of the electronic equipment, since cable connectors 3 are held by connector 5, printed circuit board 1 must be pulled out of card support cage 4 after cable connectors 3 are taken out. Further, when printed circuit board 1 mounts thereon a large-sized component or components such as a heat sink, such large-sized components must initially be removed before printed circuit board 1 is taken out of the electronic equipment.

Therefore, if printed circuit board 1 is pulled out of card support cage 4 while forgetting to remove components such as cable connectors 3, the components will be damaged or broken, with the possibility that such printed circuit board 1 cannot be re-used.

Further, when printed circuit board 1 is inserted in electronic equipment, if insertion thereof is carried out without becoming conscious of obstacles such as cable connectors 3 moving unawares to the position or positions for insertion, printed circuit board 1 and components mounted thereon would be damaged or broken by the obstacles, and as a result, printed circuit board 1 could possibly not be re-used.

SUMMARY OF THE INVENTION

Therefore, an object of the present invention is to provide an insertion/removal jig for a printed circuit board, which is capable of preventing breakage and damage to the printed circuit board and/or components mounted thereon by avoiding application of any unnecessarily excessive force to the components when carrying out the insertion and removal of the printed circuit board.

In order to achieve the above-mentioned object, an insertion/removal jig for a printed circuit board of the present invention, is constituted by comprising a card-holding portion holding a printed circuit board upon pulling out the printed circuit board, a movable frame formed to be integral with the card-holding portion, a stationary frame provided with a support point working as a fulcrum for permitting the printed circuit board to be pulled out, and holding the movable frame to be movable in a direction for insertion/removal of the printed circuit board, and a breakage-preventing portion interconnecting between the stationary frame and the support point via an elastic body shrunk by a force that is larger than a force necessary for pulling out the printed circuit board but smaller than a fixing force of components mounted on the printed circuit board.

According to the provision of the above-mentioned breakage-preventing portion, for example, even when an operation for taking out electric components such as cable connectors were forgotten before pulling out a printed circuit board from electronic equipment, the elastic body of the breakage-preventing portion will be resultantly shrunk by the action of a force smaller than the fixing force of the electric components mounted on the printed circuit board. Further, when an amount of shrinkage of the elastic body is set to be larger than a movable distance of the movable frame, an amount that the breakage-preventing portion is compressed in, i.e., the stroke of the breakage-preventing portion, is greater than the extent of movement of the movable frame, and therefore the printed circuit board will not be taken out under a condition that the cable connectors are still left as they are plugged into the associated connectors. Thus, when a printed circuit board is pulled out of electronic equipment, breakage or damage to the electric components mounted on the printed circuit board can be prevented.

Further, an insertion/removal jig for a printed circuit board in accordance with the present invention, is constituted by comprising a card-holding portion holding a printed circuit board upon inserting the printed circuit board, a movable frame formed to be integral with the card-holding portion, a stationary frame provided with a support point working as a fulcrum for permitting the printed circuit board to be inserted, and holding the movable frame to be movable in a direction for insertion and removal of the printed circuit board, and a breakage-preventing portion interconnecting between the stationary frame and the support point via an elastic body extended by a force that is larger than a force necessary for inserting the printed circuit board but smaller than a fixing force of components mounted on the printed circuit board.

According to the above-mentioned provision of the breakage-preventing portion, even when an attempt is made to insert the printed circuit board in electronic equipment under a condition where any obstacle exists at the position for the insertion of the printed circuit board might cause interference with electric components on the printed circuit board, the elastic body of the breakage-preventing portion will be overcome to be resultantly extended by a fixing force of the components mounted on the printed circuit board. Further, when the length of extension of the elastic body is set larger than a movable distance of the movable frame, the length that the breakage-preventing portion is pulled out, i.e., and therefore the printed circuit board cannot be inserted under a condition where any obstacles exists at the position for the insertion of the printed circuit board. Accordingly, when a printed circuit board is inserted in electronic equipment, breakage of or damage to the electronic components on the printed circuit board can be prevented.

The above and other objects, features and advantages of the present invention will become apparent from the following description with reference to the accompanying drawings which illustrate examples of the present invention.

DETAILED DESCRIPTION OF THE PREFERRED EMBODIMENTS

The present invention proposes a novel mechanism for preventing the pulling out or taking out of a printed circuit board of electronic equipment while forgetting to perform an operation for removing electric components such as cable connectors before removing the printed circuit board. The present invention also proposes a mechanism for preventing the insertion of a printed circuit board in electronic equipment under a condition where any obstacle exists at the position for the insertion.

First Embodiment

Figure 1:
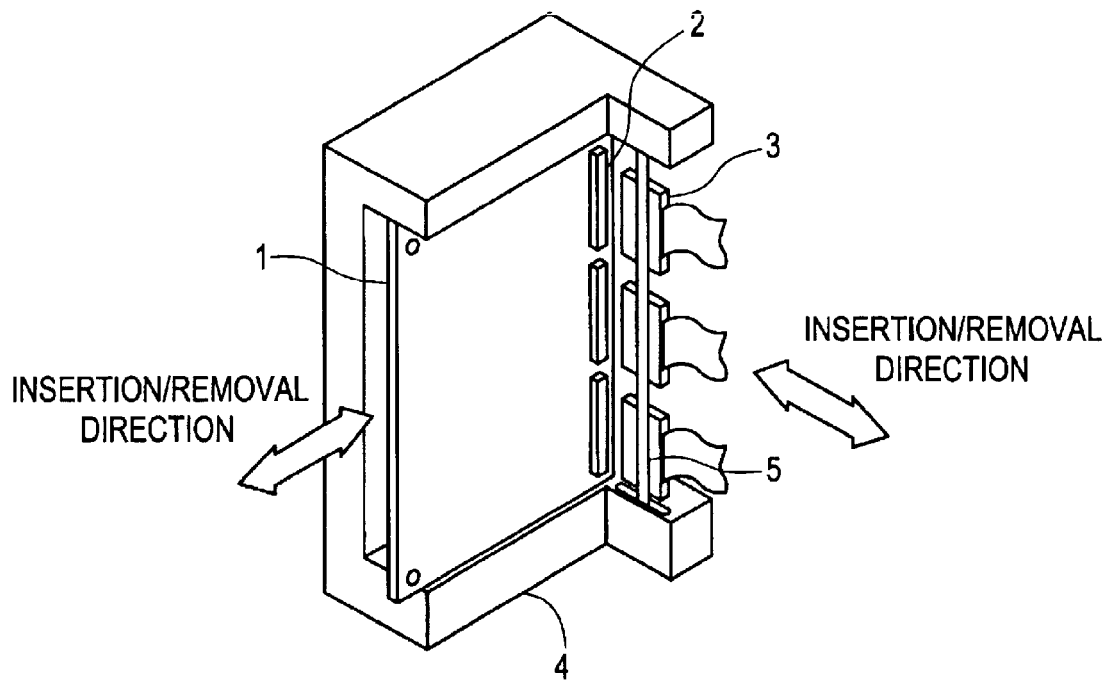
FIG. 1 is a perspective view illustrating an example of the composition of electronic equipment in which a printed circuit board is inserted.
Figure 2:
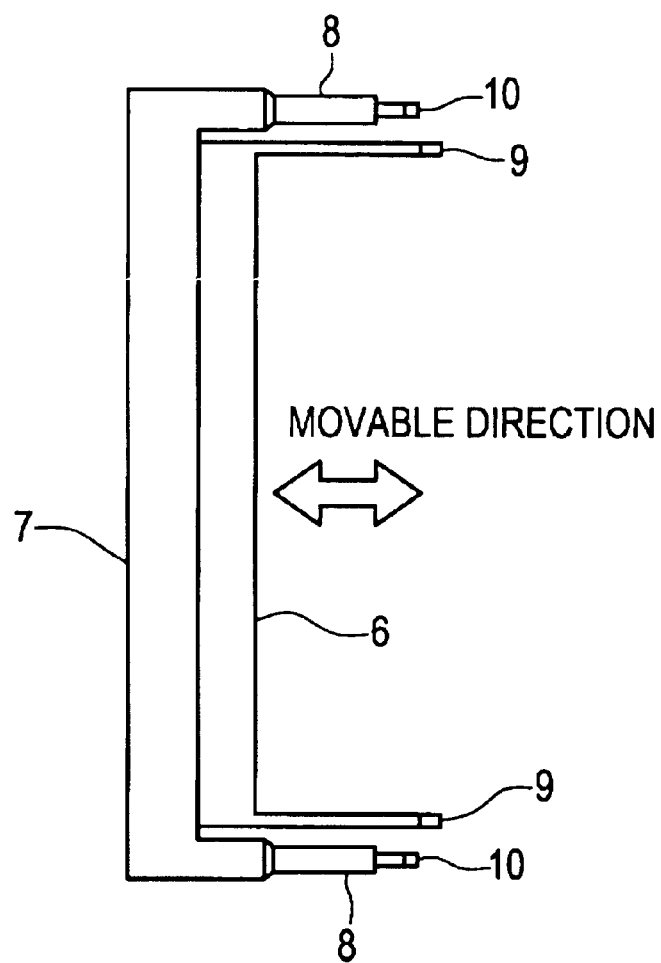
FIG. 2 is a plan view illustrating the construction of a first embodiment of an insertion/removal jig for a printed circuit board in accordance with the present invention.

An insertion/removal jig for a printed circuit board according to the first embodiment is a jig for removing printed circuit board 1 from the inside of electronic equipment. As shown in FIG. 2, the jig is constituted so as to have card-holding portions 9 for holding printed circuit board 1 when printed circuit board 1 is taken out, a movable frame 6 formed to be integral with card-holding portions 9 and capable of moving in a direction for the insertion and removal, stationary frame 7 provided with a support point functioning as a fulcrum about which the removal of printed circuit board 1 is carried out, and movably holding movable frame 6, a breakage-preventing portion 8 provided between support points 10 and stationary frame 7. Printed circuit board 1 is provided with openings formed therein, and therefore when printed circuit board 1 is pulled out, for example, boss-like projections provided at ends of card holding portions 9 are engaged in the above-mentioned openings to provide a connection between printed circuit board 1 and movable frame 6.

Figure 3:
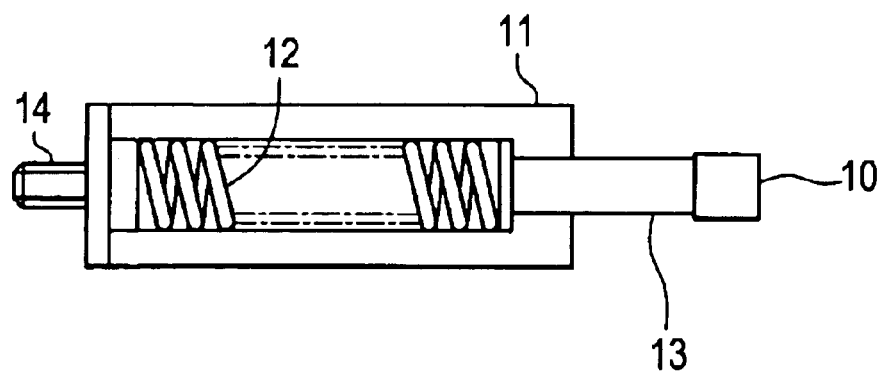
FIG. 3 is a cross-sectional view illustrating an example of the composition of a breakage-preventing portion as illustrated in FIG. 2.

As shown in FIG. 3, each of breakage-preventing portions 8 has spring 12 in frame 11 thereof, and spring 12 supports rod 13 having an extreme end functioning as support point 10. Further, frame 11 is secured to stationary frame 7 via fixing portion 14.

Breakage-preventing portion 8 is constructed so that when a force equal to or larger than a predetermined force is applied to support point 10, rod 13 is pushed and squeezed into frame 11, and the stiffness of spring 12 is selected and set to be stronger than a force by which printed circuit board 1 may be pulled out when, for example, cable connectors 3 are not plugged in, and to be less stronger than a fixing force by which connectors 2 are fixed to printed circuit board 1. The amount of force for squeezing rod 13 in (the stroke of rod 13) when a force greater than the predetermined force is applied to support point 10 should preferably be larger than a moving range of movable frame 6. According to this composition, when a force greater than the predetermined force is applied to support point 10 so that rod 13 is pushed and squeezed into frame 11, printed circuit board 1 cannot be pulled out.

At this stage, it should be appreciated that an elastic body such as a rubber-made body may be employed instead of spring 12, if it is possible to set the elastic body so that when a force greater than the predetermined force is applied to the elastic body in a manner similar to the case of spring 12, rod 13 is squeezed into frame 11. Nevertheless, from the viewpoint of ease in acquiring an appropriate stroke of rod 13 and in providing a later-described adjusting mechanism, spring 12 should desirably be used for constituting the elastic body.

Figure 4:
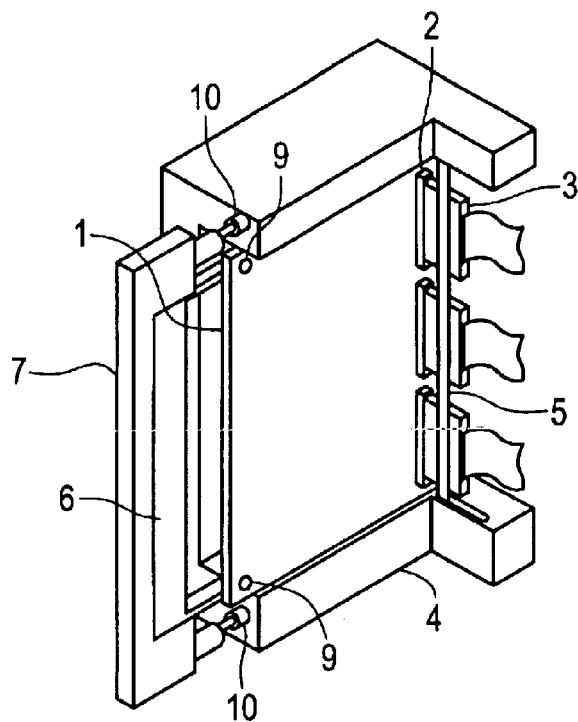
FIG. 4 is a perspective view illustrating a state of taking out a printed circuit board of electronic equipment by the use of the insertion/removal jig for a printed circuit board as illustrated in FIG. 2.

When printed circuit board 1 is pulled out of electronic equipment by the use of the insertion/removal jig for a printed circuit board as shown in FIG. 2, the projections provided at the extreme ends of card-holding portions 9 are engaged in the openings of printed circuit board 1 as shown in FIG. 4, to provide a connection between printed circuit board 1 and movable frame 6. Subsequently, support points 10 are pressed against the frame of electronic equipment, and then, for example, movable frame 6 and stationary frame 7 are simultaneously grasped so as to draw movable frame 6 toward stationary frame 7. At this moment, since stationary frame 7 is rigidly supported by support points 10, printed circuit board 1 connected to movable frame 6 is pulled out about support points 10 functioning as a fulcrum, respectively.

However, for example, when cable connectors 3 are left as they are plugged in associated connectors 2, spring 12 of breakage-preventing portion 8, illustrated in FIG. 3, is overcome by the fixing force of connectors to cause shrinkage. Further, although movable frame 6 could move to a position where it overlaps with stationary frame 7, since the amount of squeezing (the stroke) of rod 13 of breakage-preventing portion 8 is equal to or larger than the moving range of movable frame 6, printed circuit board 1 cannot be pulled out of the card support cage. Therefore, electric components such as connectors 2, mounted on printed circuit board 1 can be prevented from being broken or damaged.

At this stage, since the stiffness of spring 13 cannot be adjusted, when either a force necessary for pulling out printed circuit board 1 changes or components, which are objectives to be protected against breakage, are changed, a problem occurs whereby breakage-preventing portion 8 cannot be immediately used.

Figure 5A:
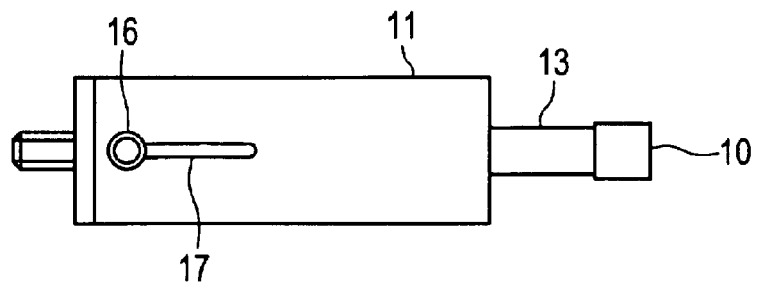
FIG. 5A is a side view illustrating an example of adjusting mechanism of the breakage-preventing portion as illustrated in FIG. 2.
Figure 5B:
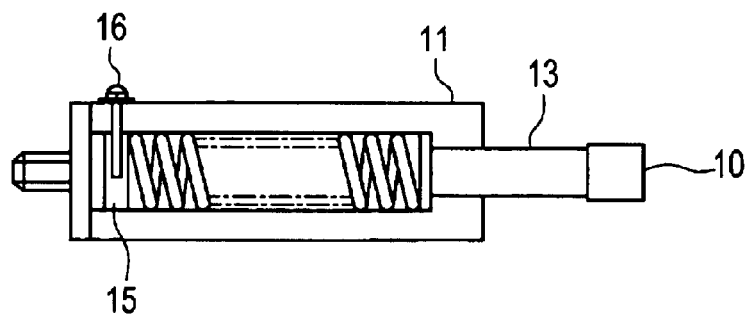
FIG. 5B is a cross-sectional view illustrating an example of adjusting mechanism of the breakage-preventing portion as illustrated in FIG. 2.

Therefore, for example, as illustrated in FIGS. 5A and 5B, a movable plate 15 is attached to an end of spring 12 of breakage-preventing portion 8 in a manner such that movable plate 15 may be fixed by screw 16 at a desired position within adjusting slot 17 formed in frame 11. The provision of such adjusting mechanism enables it to adjust a force for causing the squeezing of rod 13 into frame 11, depending on an initial value set for the length of spring 12. As a result, the force for pulling out printed circuit board 1 can be set at an optimum value.

It should however be noted that the described breakage-preventing portion should not necessarily be provided for the insertion/removal jig for a printed circuit board, and it may be provided for card support cage 4 (the frame) of electronic equipment. Then, for example, a composition may be adopted in which grooves are provided in card support cage 4 at positions thereof where the support points of the insertion/removal jig for a printed circuit board are brought into press-contact with, and respective support plates assumed by springs are arranged to constitute an adjusting mechanism. If this type of breakage-preventing portions are provided for every position for the insertion of printed circuit board 1, and when every printed circuit board 1 is pulled out, and when the above-mentioned support plates are set to be moved back into the grooves if a force greater than a predetermined force is applied, printed circuit board 1 will not be pulled out of card support cage 4, and thus preventing electronic components such as connectors mounted on printed circuit board 1 from being broken. It should further be noted that, when the breakage-preventing portions are provided for the card support cage (the frame) of the electronic equipment, an adjusting mechanism having a construction thereof similar to that illustrated in FIGS. 5A and 5B may be provided.

Second Embodiment

Figure 6:
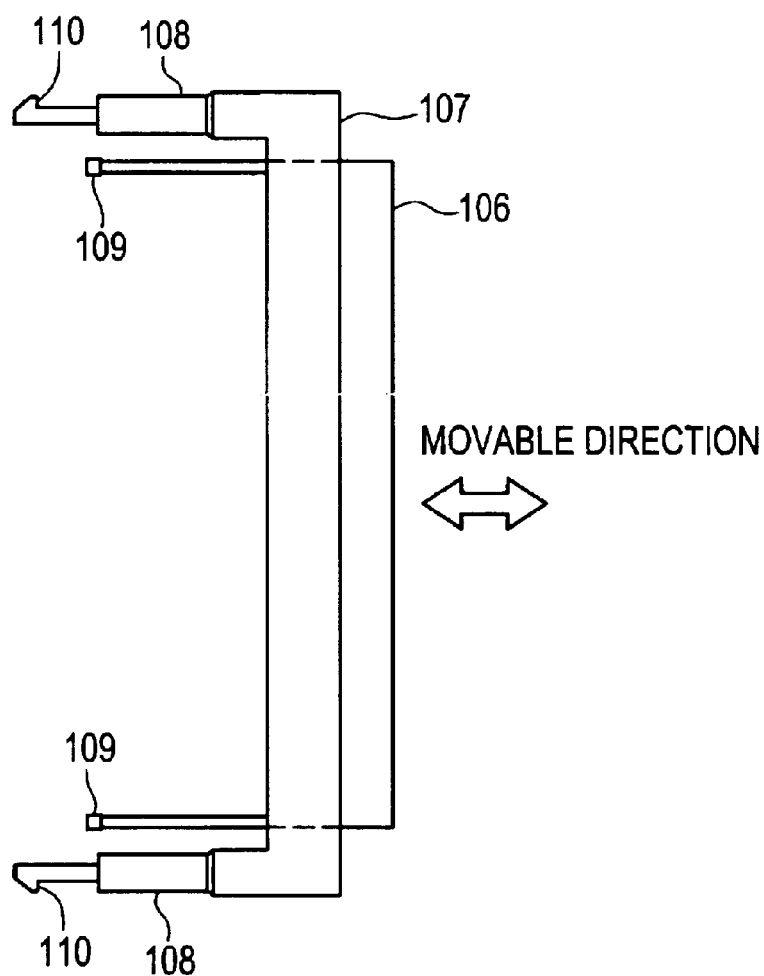
FIG. 6 is a plan view illustrating the construction of a second embodiment of an insertion/removal jig for a printed circuit board in accordance with the present invention.

An insertion/removal jig for a printed circuit board according to the second embodiment is intended for inserting printed circuit board 1 in electronic equipment, and as illustrated in FIG. 6, the jig has such a composition that card-holding portion 109 for holding printed circuit board 1 when inserting it in the electronic equipment, a movable frame 106 formed integrally with card-holding portion 109 and capable of moving in a direction for the insertion and removal, stationary frame 107 provided with support points 110 functioning as a fulcrum when printed circuit board 1 is inserted, and holding movable frame 106 movably, and a breakage-preventing portion 108 arranged between stationary frame 107 and support points 110. Printed circuit board 1 is provided with openings formed therein, and therefore, for example, when boss-like projections are engaged in the openings upon insertion of printed circuit board 1, an interconnection between printed circuit board 1 and movable frame 106 is established.

Figure 7:
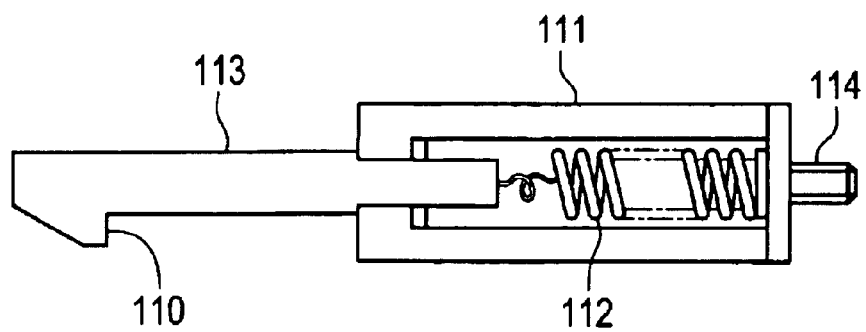
FIG. 7 is a cross-sectional view illustrating an example of the composition of a breakage-preventing portion as illustrated in FIG. 6.

As illustrated in FIG. 7, each breakage-preventing portion 108 is constructed to have spring 112 in frame 111, and rod 113 supported by spring 112 and forming support point 110 provided with a turn up portion at the extreme end thereof. Frame 111 is attached to stationary frame 107 via fixing portion 114.

Breakage-preventing portion 108 has such a construction that when a force greater than a predetermined force is applied to support point 110, rod 113 is extracted from frame 111. The stiffness of spring 112, for example, is set so as to be stronger than a force for inserting printed circuit board 1 but to be weaker than a fixing force of a predetermined component mounted on printed circuit board 1. The length of extraction (the stroke) of rod 113 upon application of a force greater than the predetermined force should desirably be equal to or more than a moving length of movable frame 106. In this composition, when rod 113 is extracted from frame 111 due to an application of a force greater than the predetermined force, printed circuit board 1 cannot be inserted.

It will be understood that an elastic body such as a rubber-made body may be provided instead of spring 112, if it were possible to set the elastic body so that rod 113 could be extracted against the force of elastic body in a way similar to the case of spring 112, due to application of a force greater than the predetermined force. However, from the viewpoint of ease in acquiring necessary stroke of rod 113 and in providing a later-described adjusting mechanism, employment of spring 112 working as an elastic body is preferable.

Figure 8:
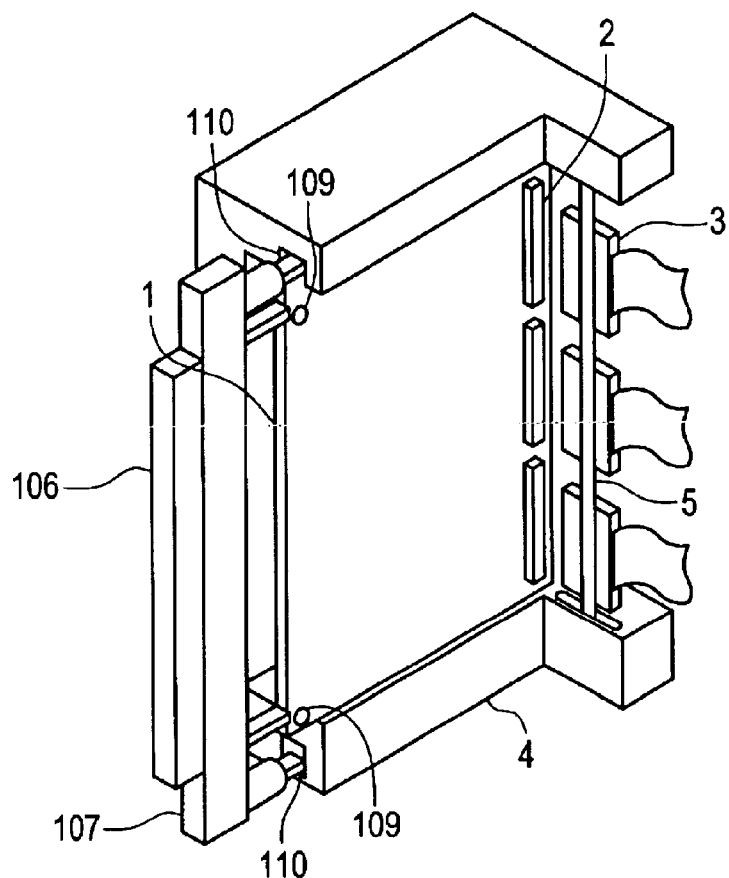
FIG. 8 is a perspective view illustrating a state of inserting a printed circuit board in electronic equipment by the use of the insertion/removal jig for a printed circuit board as illustrated in FIG. 6.

When printed circuit board 1 is inserted in electronic equipment by the use of the insertion/removal jig for a printed circuit board as shown in FIG. 6, the projections provided at the extreme ends of card-holding portions 109 are engaged in the openings of printed circuit board 1, as shown in FIG. 8, to establish interconnection between printed circuit board 1 and movable frame 106. Subsequently, support points 110 are engaged in recessed portions provided for the electronic equipment frame, for example, both movable and stationary frames 106 and 107 are simultaneously manually grasped so that movable frame 106 is urged toward stationary frame 107. At this moment, since stationary frame 107 is rigidly supported by support points 110, printed circuit board 1 interconnected with movable frame 106 is moved together with movable frame 106 with respect to fulcrum provided by support points 110, and can be eventually inserted.

Nevertheless, if there were any intended component or obstacle at a position for the insertion of printed circuit board 1 so as to cause interference with the component mounted on the board, springs 112 of respective breakage-preventing portions 108 as shown in FIG. 7 will be overcome by the fixing force of the components mounted on printed circuit board 1 to be eventually extended. Further, although movable frame 106 may be moved to a position where it overlaps with stationary frame 107, since the length of extraction of rod 113 (the stroke of rod 113) of breakage-preventing portion 108 is set to be equal to or larger than the moving extent of movable frame 106, printed circuit board 1 cannot be inserted into card support cage 4. Therefore, breakage of printed circuit board 1 and/or electronic components can be prevented.

Like the first embodiment, in breakage-preventing portion 108 as shown in FIG. 7, the stiffness of spring 112 cannot be changed. Thus, either when a force necessary for the insertion of printed circuit board 1 changes or when objective components to be prevented from being broken are changed to different ones, breakage-preventing portion 108 cannot be directly used.

Figure 9A:
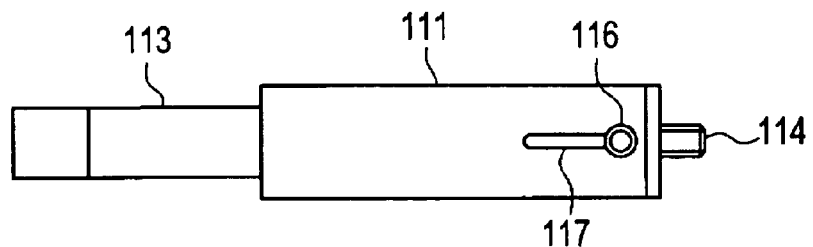
FIG. 9A is a side view illustrating an example of adjusting mechanism of the breakage-preventing portion as illustrated in FIG. 6.
Figure 9B:
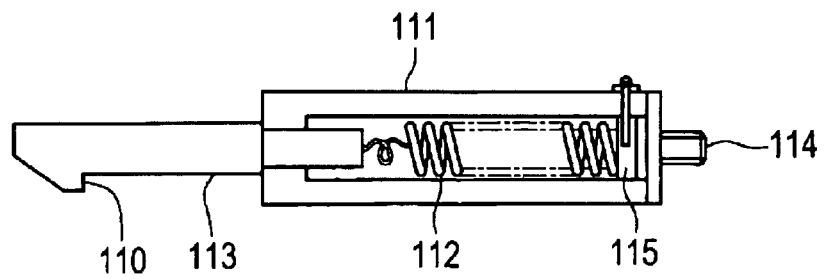
FIG. 9B is a cross-sectional view illustrating an example of adjusting mechanism of the breakage-preventing portion as illustrated in FIG. 6; and, FIG. 10 is a plan view illustrating the construction of a third embodiment of an insertion/removal jig for a printed circuit board in accordance with the present invention.

Thus, for example, as illustrated in FIGS. 9A and 9B, a movable plate 115 is attached to an end of spring 112 of breakage-preventing portion 108 in a manner such that movable plate 115 may be fixed by a screw 116 at a desired position within adjusting slot 117 formed in frame 111. According to provision of such adjusting mechanism, as it is possible to adjustably change a force by which rod 113 is extracted, through an adjustment of initial value of the length of spring 112, a force for the insertion of printed circuit board 1 can be set at an optimum value.

It should be noted that the breakage-preventing portion should not necessarily be provided for the insertion/removal jig for a printed circuit board but may be provided for card support cage (the frame) 4 of the electronic equipment. In that case, like the first embodiment, a composition may be adopted in which grooves are provided in card support cage 4 at positions thereof where turn up portions working as support points of the insertion/removal jig for a printed circuit board are brought into press-contact with, and support plates assumed by springs are arranged in such grooves. When this latter breakage-preventing portion is arranged at every position for the insertion of printed circuit boards 1, and when the above-mentioned support plate is set to be moved back due to the application of a force greater than a predetermined force upon insertion of printed circuit board 1, such board 1 will be prevented from being inserted in card support cage, so that breakage of electric and electronic components such as connectors, mounted on printed circuit board 1 may be prevented from being broken or damaged. In the case where the breakage-preventing portion is provided for the card support cage (the frame) of electronic equipment, an adjusting mechanism having a construction similar to that illustrated in FIGS. 5A and 5B may be provided.

Third Embodiment

As illustrated in FIG. 10, an insertion/removal jig for a printed circuit board according to the third embodiment is provided with a composition in which the insertion/removal jig for a printed circuit board according to the first embodiment shown in FIG. 2 is combined with the insertion/removal jig for a printed circuit board according to the second embodiment shown in FIG. 6, and may be used for both taking out printed circuit board 1 from electronic equipment and the insertion of printed circuit board 1 into the electronic equipment.

As will be illustrated in FIG. 10, the insertion/removal jig for a printed circuit board according to the present embodiment is constituted to have movable frame 206 capable of moving in a direction for the insertion and removal of the board, and stationary frame 207 including support points 210 working as a fulcrum upon either inserting or pulling out printed circuit board 1 and holding movable frame 206 movably. Further, in the composition, movable frame 206 is provided with extreme ends having, formed thereat, card-holding portions 209 for holding printed circuit board 1 when the board is either inserted or taken out. Furthermore, breakage-preventing portions 208 are provided between stationary frame 207 and support points 210.

It should be noted that card-holding portions 209, breakage-preventing portions 208 and support points 210 of the insertion/removal jig for a printed circuit board according to the present embodiment are provided with such a construction that the portions located on the right half side of the drawing of FIG. 10 (the removal region) are constructed in a similar manner to those of the first embodiment, and the portions located on the left half side of the same drawing (the insertion region) are constructed in a similar manner to those of the second embodiment. Therefore, any detailed descriptions of these portions will be omitted hereinafter for brevity sake.

It should be understood that the insertion/removal jig for a printed circuit board according to the third embodiment, as shown in FIG. 10 may be provided with adjusting mechanisms for respective breakage-preventing portions in a similar manner to those provided for the first and second embodiments, and that the breakage-preventing portions may be provided for card support cage 4 of electronic equipment.

When removal of printed circuit board 1 is carried out by an identical proceeding with that of the first embodiment by the employment of the insertion/removal jig for a printed circuit board having above-described composition, it is possible, like the first embodiment, to prevent breakage or damage of electric and electronic components mounted on printed circuit board 1 upon pulling out the board from electronic equipment. Further, when printed circuit board 1 is inserted by an identical proceeding with that of the second embodiment, it is possible, like the second embodiment, to prevent breakage or damage of the components mounted on printed circuit board 1 upon inserting the board into electronic equipment.

In the described first through third embodiments, the stationary frame of the insertion/removal jig for a printed circuit board is embodied so as to be supported at two support points, both of which are provided with a breakage-preventing portion, respectively. However, it should be appreciated that the number of support points may be varied in relation to the shape of a printed circuit board and that of the frame of electronic equipment. Also, the breakage-preventing portion may be provided either for every support point or at least for one of a plurality of support points.

Furthermore, the card-holding portion may have any construction provided that such portion could be interconnected with a printed circuit board when the insertion or extraction of the printed circuit board is carried out. Thus, for example, the card-holding portion may be constructed to grasp a printed circuit board 1.

While a preferred embodiment of the present invention has been described using specific terms, such description is for illustrative purposes only, and it is to be understood that changes and variations may be made without departing from the spirit or scope of the following claims.

What is claimed is:

1. An insertion/removal jig for a printed circuit board for pulling out the printed circuit board from electronic equipment, comprising:

a card-holding portion for holding said printed circuit board upon pulling out said printed circuit board;

a movable frame formed to be integral with said card-holding portion;

a stationary frame provided with a support point working as a fulcrum for permitting said printed circuit board to be pulled out, and holding said movable frame to be movable in a direction for insertion and removal of said printed circuit board; and a breakage-preventing portion interconnecting between said stationary frame and said support point via an elastic body, wherein a compression stiffness of said elastic body is larger than a force necessary for pulling out said printed circuit board when no component is mounted on said circuit board but smaller than a force necessary for pulling out said printed circuit board when said component is mounted on said circuit board.

2. The insertion/removal jig for a printed circuit board according to claim 1, wherein an amount of shrinkage of said elastic body is set to be larger than a movable distance of said movable frame.

3. The insertion/removal jig for a printed circuit board according to claim 1, further comprising an adjusting mechanism for adjusting said compression stiffness of said elastic body.

4. The insertion/removal jig for a printed circuit board according to claim 3, wherein said elastic body comprises a spring.

5. An insertion/removal jig for a printed circuit board for inserting a printed circuit board in electronic equipment comprising:
   a card-holding portion for holding said printed circuit board upon inserting said printed circuit board;
   a movable frame formed to be integral with said card-holding portion;
   a stationary frame provided with a support point working as a fulcrum for permitting said printed circuit board to be inserted, and holding said movable frame to be movable in a direction for insertion and removal of said printed circuit board; and
   a breakage-preventing portion interconnecting between said stationary frame and said support point via an elastic body,
   wherein a tensile stiffness of said elastic body is larger than a force necessary for inserting said printed circuit board when no obstacle is present and smaller than a force for inserting said printed circuit board when an obstacle is present.

6. The insertion/removal jig for a printed circuit board according to claim 5, wherein an amount of extension of said elastic body is set to be larger than a movable distance of said movable frame.

7. The insertion/removal jig for a printed circuit board according to claim 5, further comprising an adjusting mechanism for adjusting said tensile stiffness of said elastic body.

8. The insertion/removal jig for a printed circuit board according to claim 7, wherein said elastic body comprises a spring.

9. An electronic equipment frame for holding a printed circuit board in a manner of freely inserting said printed circuit board therein and pulling out said printed circuit board thereof by employment of an insertion/removal jig for a printed circuit board including a card-holding portion holding said printed circuit board upon pulling out said printed circuit board, a movable frame formed to be integral with said card-holding portion, and a stationary frame provided with a support point working as a fulcrum for permitting said printed circuit board to be pulled out, and holding said movable frame to be movable in a direction for insertion and removal of said printed circuit board, comprising:
   a breakage-preventing portion provided for every position where said printed circuit board is inserted, said breakage-preventing portion supporting said support point of said insertion/removal jig for a printed circuit via an elastic body,
   wherein a compression stiffness of said elastic body is larger than a force necessary for pulling out said printed circuit board when no component is mounted on said circuit board but smaller than a force necessary for pulling out said printed circuit board when said component is mounted on said circuit board.

10. The electronic equipment frame according to claim 9, wherein an amount of shrinkage of said elastic body is set to be larger than a movable distance of said movable frame.

11. The electronic equipment frame according to claim 9, further comprising an adjusting mechanism for adjusting said compression stiffness of said elastic body.

12. The electronic equipment frame according to claim 11, wherein said elastic body comprises a spring.

13. An electronic equipment frame for holding a printed circuit board in a manner of freely inserting said printed circuit board therein and pulling out said printed circuit board thereof by employment of an insertion/removal jig for a printed circuit board including a card-holding portion holding said printed circuit board upon inserting said printed circuit board, a movable frame formed to be integral with said card-holding portion, and a stationary frame provided with a support point working as a fulcrum for permitting said printed circuit board to be inserted, and holding said movable frame to be movable in a direction for insertion and removal of said printed circuit board, comprising:
   a breakage-preventing portion provided for every position where said printed circuit board is inserted, said breakage-preventing portion supporting said support point of said insertion/removal jig for a printed circuit via an elastic body,
   wherein a tensile stiffness of said elastic body is larger than a force necessary for inserting said printed circuit board when no obstacle is present but smaller than a force for inserting said printed circuit board when an obstacle is present.

14. The electronic equipment frame according to claim 13, wherein an amount of shrinkage of said elastic body is set to be larger than a movable distance of said movable frame.

15. The electronic equipment frame according to claim 13, further comprising an adjusting mechanism for adjusting said tensile stiffness of said elastic body.

16. The electronic equipment frame according to claim 15, wherein said elastic body comprises a spring.

* * * * *